(12) United States Patent
Jeon et al.

(10) Patent No.: US 10,242,848 B2
(45) Date of Patent: Mar. 26, 2019

(54) CARRIER RING STRUCTURE AND CHAMBER SYSTEMS INCLUDING THE SAME

(71) Applicant: Lam Research Corporation, Fremont, CA (US)

(72) Inventors: Eli Jeon, Sherwood, OR (US); Nick Ray Linebarger, Jr., Beaverton, OR (US); Sirish Reddy, Tualatin, OR (US); Alice Hollister, Tualatin, OR (US); Rungthiwa Methaapanon, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 555 days.

(21) Appl. No.: 14/568,608

(22) Filed: Dec. 12, 2014

(65) Prior Publication Data
US 2016/0172165 A1   Jun. 16, 2016

(51) Int. Cl.
*H01L 21/67* (2006.01)
*H01L 21/687* (2006.01)
(Continued)

(52) U.S. Cl.
CPC .. *H01J 37/32715* (2013.01); *H01J 37/32733* (2013.01); *H01L 21/68735* (2013.01);
(Continued)

(58) Field of Classification Search
USPC .................. 118/715–733; 156/345.1–345.55
See application file for complete search history.

(56) References Cited

U.S. PATENT DOCUMENTS

| 5,746,460 A | 5/1998 | Marohl et al. ................. 294/1.1 |
| 5,810,935 A | 9/1998 | Lee et al. ..................... 118/728 |

(Continued)

FOREIGN PATENT DOCUMENTS

| JP | H04-365317 A | 12/1992 | ........... H01L 21/203 |
| JP | 2005-38947 A | 2/2005 | ............ H01L 21/66 |

(Continued)

OTHER PUBLICATIONS

Taiwan Pat. App. No. 104141217, Notification of Examination Opinions and Search Report, English language, 10720754540, dated Aug. 20, 2018.

(Continued)

*Primary Examiner* — Parviz Hassanzadeh
*Assistant Examiner* — Tiffany Z Nuckols
(74) *Attorney, Agent, or Firm* — Penilla IP, APC (57) ABSTRACT

A carrier ring for use in a chamber implemented for depositing films and chambers that use the carrier ring are provided. The carrier ring has an annular disk shape with an outer edge side and a wafer edge side. The carrier ring has a top carrier ring surface that extends between the outer edge side to the wafer edge side. The wafer edge side includes a lower carrier ring surface that is lower than the top carrier ring surface. The wafer edge side also includes a plurality of contact support structures. Each contact support structure is located at an edge of the lower carrier ring surface and has a height that is between the lower carrier ring surface and the top carrier ring surface, and the contact support structure has tapered edges and corners. A step is defined between the top carrier ring surface and the lower carrier ring surface, such that a top facing edge is disposed at a top of the step and a lower inner edge is disposed at the bottom of the step. Each of the top facing edge and the lower inner edge have a rounded non-sharp edge and a top of each of the contact (Continued)

support structures is configured for contact with a bottom edge surface of a wafer for lifting and lowering and moving the wafer.

24 Claims, 8 Drawing Sheets

(51) Int. Cl.
    *H01L 21/683*     (2006.01)
    *C23C 14/50*     (2006.01)
    *C23C 16/452*     (2006.01)
    *H01J 37/32*     (2006.01)
    *H01L 21/285*     (2006.01)
    *C23C 16/458*     (2006.01)
    *C23C 16/455*     (2006.01)
    *H01L 21/02*     (2006.01)
    *C23C 16/52*     (2006.01)

(52) U.S. Cl.
    CPC ...... *C23C 16/458* (2013.01); *C23C 16/45544* (2013.01); *C23C 16/52* (2013.01); *H01L 21/0228* (2013.01); *H01L 21/0262* (2013.01); *H01L 21/28556* (2013.01); *H01L 21/67* (2013.01)

(56) References Cited

U.S. PATENT DOCUMENTS

| | | | |
|---|---|---|---|
| 6,143,082 A * | 11/2000 | McInerney | C23C 16/4412 118/719 |
| 6,183,026 B1 | 2/2001 | Cai et al. | 294/64.1 |
| 6,275,748 B1 | 8/2001 | Bacchi et al. | 700/275 |
| 7,140,655 B2 | 11/2006 | Kesil et al. | 294/104 |
| 8,752,872 B2 | 6/2014 | Kent | 294/90 |
| 2007/0283884 A1 | 12/2007 | Tiller et al. | 118/715 |
| 2009/0096229 A1 | 4/2009 | Bonora et al. | 294/64.1 |
| 2009/0255901 A1* | 10/2009 | Okita | H01J 37/321 216/67 |
| 2010/0065216 A1 | 3/2010 | Tiller et al. | 156/345.51 |
| 2012/0264051 A1* | 10/2012 | Angelov | H01L 21/683 430/256 |

FOREIGN PATENT DOCUMENTS

| | | | | |
|---|---|---|---|---|
| JP | 2005-129575 A | 5/2005 | | H01L 21/66 |
| JP | WO2010/026944 A1 | 11/2010 | | H01L 21/673 |
| JP | 2011151344 A | 8/2011 | | H01L 21/673 |
| WO | WO 99/23691 | 5/1999 | | H01L 21/00 |
| WO | WO 2005/055296 A1 | 6/2005 | | H01L 21/027 |

OTHER PUBLICATIONS

Taiwan Pat. App. No. 104141217, Notification of Examination Opinions and Search Report, 10720754540, dated Aug. 20, 2018.
JP App. No. 2015-241860, Notification of Reasons for Refusal, Draft dated Nov. 12, 2018, Meisei International Patent Firm, English translation.

* cited by examiner

CARRIER RING STRUCTURE AND CHAMBER SYSTEMS INCLUDING THE SAME

BACKGROUND

1. Field of the Invention

The present embodiments relate to semiconductor wafer processing equipment tools, and more particularly, carrier rings used in chambers. The chambers being for processing and transport of wafers.

2. Description of the Related Art

Plasma-enhanced chemical vapor deposition (PECVD) is a type of plasma deposition that is used to deposit thin films from a gas state (i.e., vapor) to a solid state on a substrate such as a wafer. PECVD systems convert a liquid precursor into a vapor precursor, which is delivered to a chamber. PECVD systems may include a vaporizer that vaporizes the liquid precursor in a controlled manner to generate the vapor precursor.

Chambers used for PECVD use ceramic pedestals for supporting the wafer during processing, which enables processing under high temperatures. One application is the deposition of ashable hardmasks (AHMs). AHMs are films used in semiconductor processing that may be removed by a technique referred to as "ashing." In particular, AHMs are often used as etch stop layers. 193 nm or lower lithography schemes require these AHMs to have high etch selectivity to underlying dielectric or metal barrier layers.

Further, some chambers used to deposit AHM materials use a carrier ring to enable movement of the wafer between processing stations. If the carrier ring is not defined with geometries that account for exposure to deposition materials, the carrier ring in the chamber may produce particles during use, e.g., wafer lifting, and may require more trouble shooting during online processing and/or downtime due to more cleanings.

Existing methods of eliminating or reducing particle sources was believed to "optimize" wafer transport through the process module. "Optimizing" wafer transport included methods such as slowing down wafer motion and also ensuring carrier rings would not rattle as they were aligned to pedestals through alignment pins—method called "clocking". "Clocking" pedestals is a laborious task and can lead to pedestal damage and slowing down wafer speeds is a throughput hit for end users.

It is in this context that inventions arise.

SUMMARY

Embodiments of the disclosure provide embodiments of a process chamber, used for processing semiconductor wafers. In one implementation, a carrier ring used in deposition chambers is provided, wherein such carrier ring includes contact support structures for lifting a wafer from an under surface near an edge. In one configuration, the contact support structures have tapered edges and corners, so that any material films formed over the top of the contact support structures are not exposed to sharp edges that would otherwise place extra stress on such material films. The top of the contact support structures are the surfaces that come into contact with the under surface of the wafer when lifted, and having tapered edges and corners is believed to reduce flaking and/or reduce particle generation during use, e.g., physical contact between the contact support structures and the under surface of the wafer.

A long-standing problem of the AHM systems have been particles which map to the location of minimum contact area (MCA) features, which are contact support structures. Based on examination and study, it is believed that particles occur once there is a undercoat/pre-coat film on the carrier rings on which the wafer is transported through a process module. Given that the particles map to the MCA locations of the carrier ring and that the particles happen if there is an undercoat/pre-coat film, it was discovered that at least some of the film was flaking off of the MCA features.

Pre-coat and undercoat layers of the film are deposited in the process chamber before wafers are processed. This pre-coat and undercoat film also finds itself on the carrier rings which come into contact with the wafer. If the film is mechanically unstable, then this pre-coat and undercoat can become a source of particles, e.g., due to film stresses, peeling and/or flaking. This is especially true when surfaces of the contact support structures, e.g., MCAs have sharp edges, points, corners, non-rounded or curved surface interfaces, or the like. This is also applicable to other films or materials, which need not be pre-coats or undercoats.

In one embodiment, the contact support structures are designed to have rounded corners, soft-edges or are void of share edges or surfaces transitions. By configuring the contact support structures to have this defined surface characteristic, it is believed that films better adhere to the MCAs. Better adhesion lowers the tendency for the film to peel once in contact with the wafer, e.g., where mechanical contact is made with to the film formed on the MCAs.

In one embodiment, a carrier ring for use in a chamber implemented for depositing films is disclosed. The carrier ring has an annular disk shape with an outer edge side and a wafer edge side. The carrier ring has a top carrier ring surface that extends between the outer edge side to the wafer edge side. The wafer edge side includes a lower carrier ring surface that is lower than the top carrier ring surface. The wafer edge side also includes a plurality of contact support structures. Each contact support structure is located at an edge of the lower carrier ring surface and has a height that is between the lower carrier ring surface and the top carrier ring surface, and the contact support structure has tapered edges and corners. A step is defined between the top carrier ring surface and the lower carrier ring surface, such that a top facing edge is disposed at a top of the step and a lower inner edge is disposed at a bottom of the step. Each of the top facing edge and the lower inner edge have a rounded non-sharp edge and a top of each of the contact support structure is configured for contact with a bottom edge surface of a wafer for lifting and lowering and moving the wafer.

In one embodiment, the wafer edge side further includes an inner contact edge at a transition between the lower carrier ring surface and the contact support structure.

In one embodiment, the tapered edges and corners of the contact support structures have a substantially curved surface that is void of sharp corners. In some embodiments, the being void of sharp corners include surfaces that are partially rounded, covered, contoured, have at least some radius at the transition between planes or points, and are void of hard or abrupt edges, corners, points and surface changes.

In one embodiment, the carrier ring is implemented in a chamber used for depositing films. The chamber includes a pedestal having a wafer support region and a carrier support surface encircling the wafer support region. The carrier support surface being a step down from the wafer support region. The chamber includes a fork having a first arm arranged around a first side portion of the pedestal and a second arm arranged around a second side portion of the pedestal. In one configuration, each of the first and second arms are located below the carrier support surface when in a non-engaged state that does not contact an under surface of the carrier ring, and when in an engaged state each of the first and second arms contact the under surface of the carrier ring to lift the carrier ring and the wafer that sits on the carrier ring together.

In another embodiment, the wafer when disposed over the wafer support region is configured to overhang over a portion of the carrier support surface, and each contact support structure is configured to be oriented under the overhang of the wafer.

In one embodiment, in the non-engaged state a non-contact separation distance is defined between the bottom edge surface of the wafer and the top of each contact support structure.

In one embodiment, in the engaged state contact is made between the bottom edge surface of the wafer and the top of each of the contact support structure, and deposition material present over the top of each contact support structure is substantially maintained over the top of each contact support structure when contact is made in the engaged state.

In one configuration, the chamber further includes a showerhead that is configured to be oriented over the pedestal during operation, and the showerhead is configured to provide process gases to enable deposition of a film over the wafer. A radio frequency (RF) power supply is connected via a match network to the pedestal, wherein during operation the RF power supply further enables the deposition of the film over the wafer.

In another embodiment, a chamber for processing deposition on a wafer is provided. The chamber includes a pedestal having a wafer support region and a carrier support surface encircling the wafer support region. The carrier support surface being a step down from the wafer support region. Also provided is a fork having a first arm arranged around a first side portion of the pedestal and a second arm arranged around a second side portion of the pedestal, such that each of the first and second arms are located below the carrier support surface when in a non-engaged state. The first and second arms of the fork are configured to rise above the carrier support surface when in an engaged state. The chamber further includes a carrier ring having an annular disk shape with an outer edge side and a wafer edge side. The carrier ring has a top carrier ring surface that extends between the outer edge side to the wafer edge side. The wafer edge side includes a lower carrier ring surface that is lower than the top carrier ring surface. The wafer edge side also includes a plurality of contact support structures, each contact support structure is located at an edge of the lower carrier ring surface and having a height that is between the lower carrier ring surface and the top carrier ring surface. Each contact support structure has tapered edges and corners. A top of each of the contact support structure is configured for contact with a bottom edge surface of the wafer when the fork lifts the carrier ring for raising and moving the wafer. Wherein lifting the carrier ring lifts the wafer that sits over the top of each of the contact support structures.

DESCRIPTION

Embodiments of the disclosure provide embodiments of a process chamber, used for processing semiconductor wafers. In one implementation, carrier ring used in deposition chambers is provided, wherein such carrier ring includes contact support structures for lifting a wafer from an under surface near an edge. In one configuration, the contact support structures have tapered edges and corners to reduce point stresses on any films deposited or formed over the contact support structures.

In one example configuration, the carrier ring is lifted from an under surface using spider forks having a pair of arms or other lifting mechanisms. When the carrier ring is lifted the carrier ring is raised to a point where the contact support structures disposed on the carrier ring come into physical contact with the under surface of the wafer, thus lifting the wafer together with the carrier ring. The spider forks can then move the wafer to another station, wherein the carrier ring and wafer are lowered.

In one configuration, a chamber includes multiple stations, e.g., such as four stations. The chamber then will include four spider forks and a carrier ring will be disposed around respective pedestals of each of the stations. In this configuration, the spider forks can simultaneously lift each of the four carrier rings (and any wafer disposed thereon), and rotate all of the carrier rings and wafers to the next station (e.g., for additional or different processing). In one configuration, the chamber has loading and unloading stations when one wafer is loaded at a time or can include parallel loading and unloading stations where two wafers are loaded and unloaded at a time.

It should be appreciated that the present embodiments can be implemented in numerous ways, such as a process, an apparatus, a system, a device, or a method. Several embodiments are described below.

Hard masks are used as etch stop layers in semiconductor processing. Ashable hard masks (AHM) have a chemical composition that allows them to be removed by a technique referred to as ashing once they have served their purpose. An ashable hard mask (AHM) is generally composed of carbon and hydrogen with a trace amount of one or more dopants (e.g., nitrogen, fluorine, boron, silicon). The bonding structure in these hard masks can vary from sp2 (graphite-like) to sp3 (diamond-like) or a combination of both, depending on the deposition conditions. In a typical application, after etching the hard mask has served its purpose it must be removed from the underlying dielectric oxide (e.g., SiO2). This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Deposition of films is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer.

Figure 1:
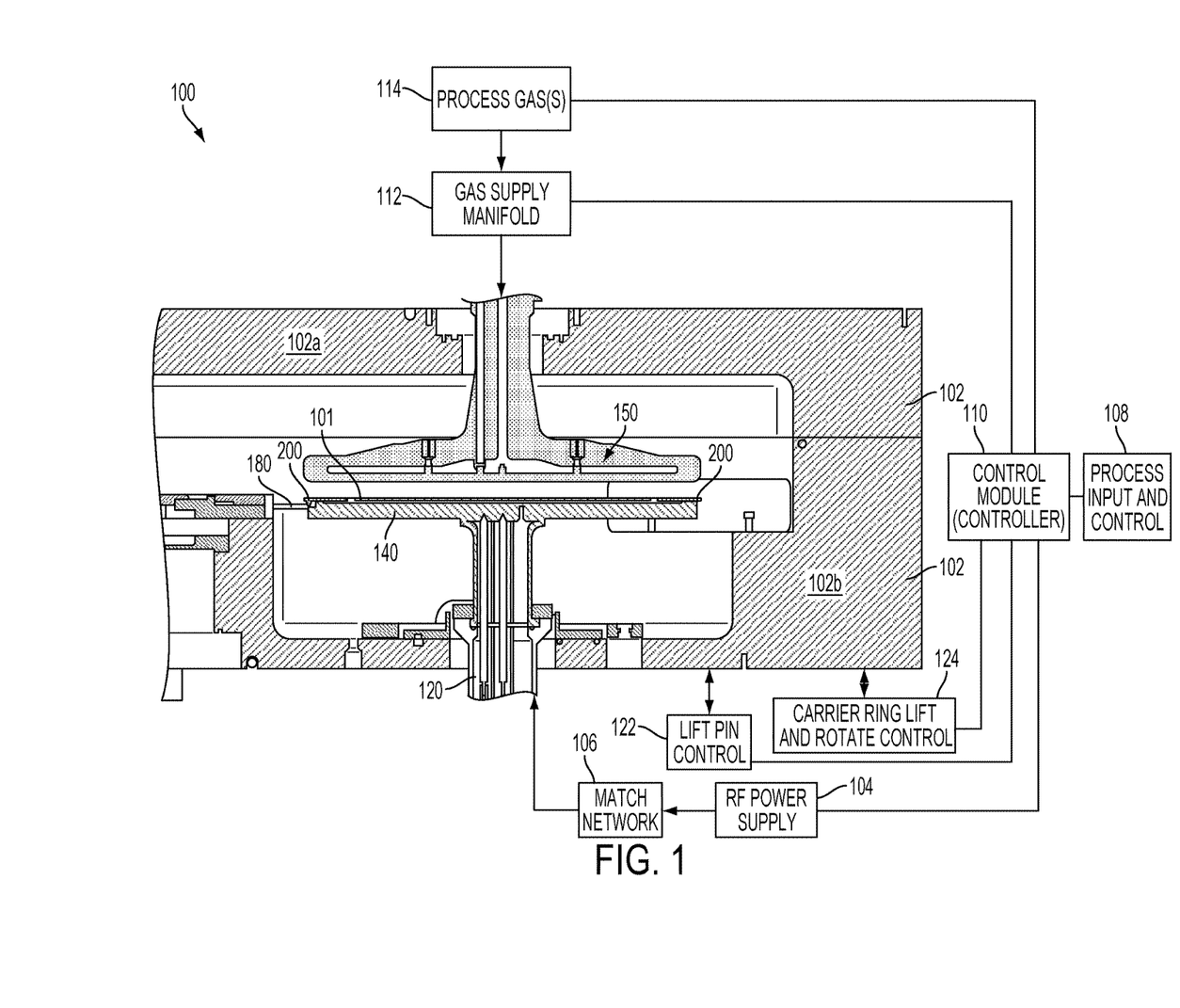
FIG. 1 illustrates a substrate processing system, which is used to process a wafer, e.g., to form films thereon.

FIG. 1 illustrates a substrate processing system 100, which is used to process a wafer 101. The system includes a chamber 102 having a lower chamber portion 102b and an upper chamber portion 102a. A center column is configured to support a pedestal 140, which in one embodiment is a powered electrode. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gasses, mechanical movement of the wafer 101, etc., such as to deposit or form films over the wafer 101. As mentioned above, one such film that can be formed over the wafer 101 is an ashable hard mask (AHM).

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the showerhead 150 face that faces that wafer 101 and the wafer 101 resting over the pedestal 140.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system. More detail regarding the carrier ring 200 is provided below with reference to FIGS. 5A-7C.

Figure 2:
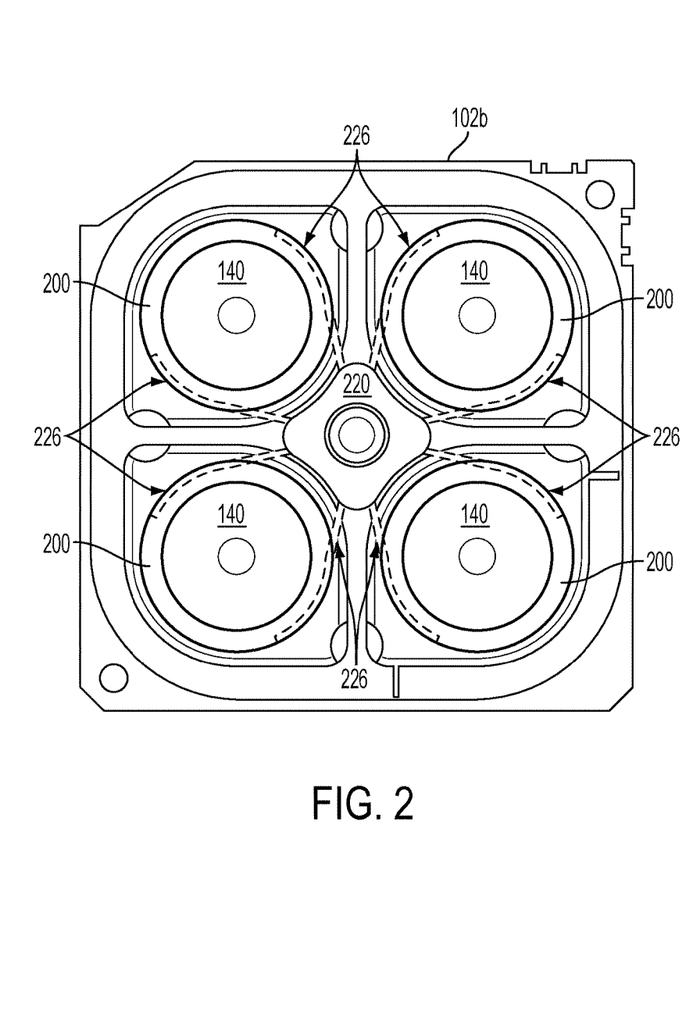
FIG. 2 illustrates a top view of a multi-station processing tool, wherein four processing stations are provided, in accordance with one embodiment.

FIG. 2 illustrates a top view of a multi-station processing tool, wherein four processing stations are provided. This top view is of the lower chamber portion 102b (e.g., with the top chamber portion 102a removed for illustration), wherein four stations are accessed by spider forks 226. Each spider fork, or fork includes a first and second arm, each of which is positioned around a portion of each side of the pedestal 140. In this view, the spider forks 226 are drawn in dash-lines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3:
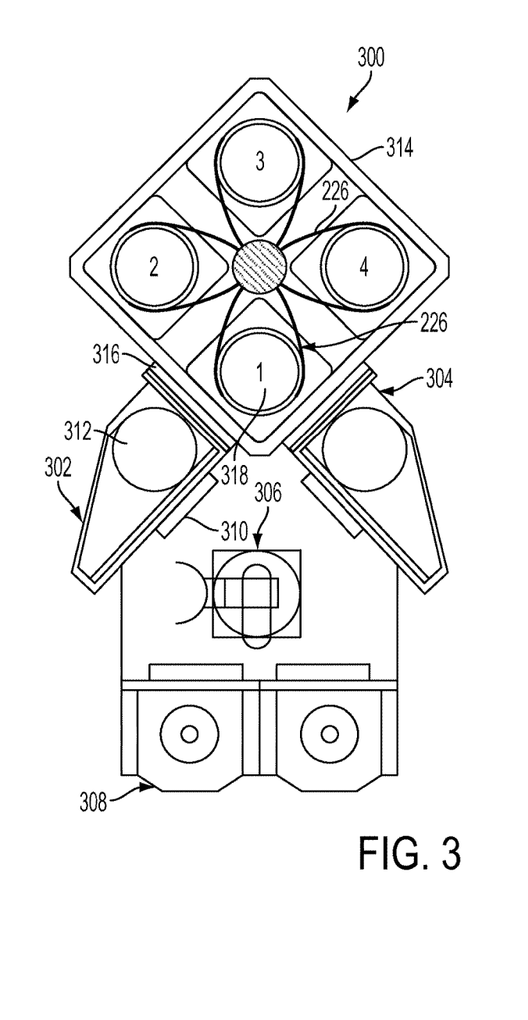
FIG. 3 shows a schematic view of an embodiment of a multi-station processing tool with an inbound load lock and an outbound load lock, in accordance with one embodiment.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport 316 is opened, another robot (not shown) may move the substrate from inbound load lock 302 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

FIG. 3 also depicts spider forks 226 for transferring substrates within processing chamber 102b. As will be described in more detail below, the spider forks 226 rotate and enable transfer of wafers from one station to another. The transfer occurs by enabling the spider forks 226 to lift carrier rings 200 from an outer undersurface, which lifts the wafer, and rotates the wafer and carrier together to the next station. In one configuration, the spider forks 226 are made from a ceramic material to withstand high levels of heat during processing.

Figures 4A, 4B:
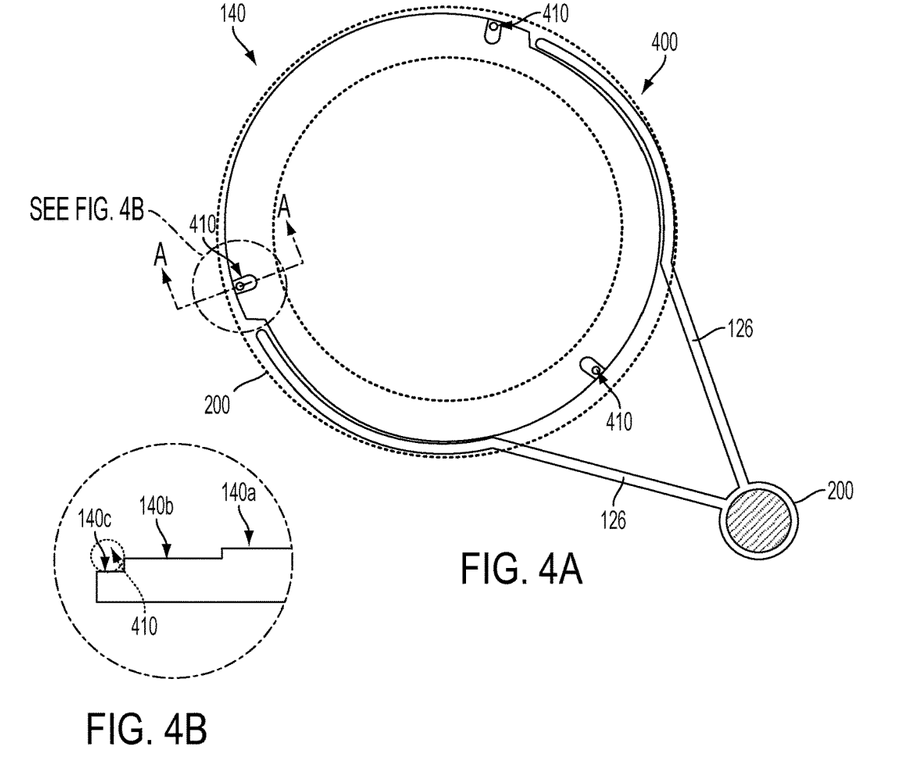
FIG. 4A illustrates a top view of a pedestal and the arms of spider forks, in accordance with one embodiment.
FIG. 4B illustrates a magnification cross-section of the pedestal edge, in accordance with one embodiment.

FIG. 4A illustrates a top view 400 of the pedestal 140 and the arms of spider forks 126. A dash-line illustrates the location of the carrier ring 200, when it sits over the pedestal 140 as an annular ring, around the periphery of the pedestal. Each arm is configured to sit at opposite side regions of the pedestal 140 side body, wherein the pedestal 140 side body has recessed regions to enable the arms of the spider forks 126 to sit. This orientation allows for the carrier ring 200 to be placed over the pedestal 140 and for the arms of the spider forks 126 to sit under the carrier ring 200, when placed thereon. In this example illustration, the pedestal 140 has a wafer support region 140a, a carrier support surface 140b, and an engagement step 140c, as shown in FIG. 4B. The carrier support surface 140 resides at a step below the wafer support region 140a surface. This allows for the carrier support surface 140b to receive the carrier ring 200, and such that the carrier ring 200 is held in place by extensions of the carrier ring 200 fitting into the engagement locations 410.

The carrier support surface 140a is shaped as an annular disk surface that surrounds the wafer support region 140a at a lower step level. The arms of the spider forks 126 will generally reside just under the level of the carrier support surface 140b when in a non-engaged state (i.e., the spider forks are not in physical contact with the underside of the carrier ring 200). When the arms of the spider fork 126 are in an engaged state, the arms are raised so that contact is made by the first and second arms of the spider forks 126 with an underside of the carrier ring 126. This allows the carrier ring 200 to be lifted by the arms of the spider forks 126 and then moved, e.g., rotated to another station by mechanism 220.

Figure 4C:
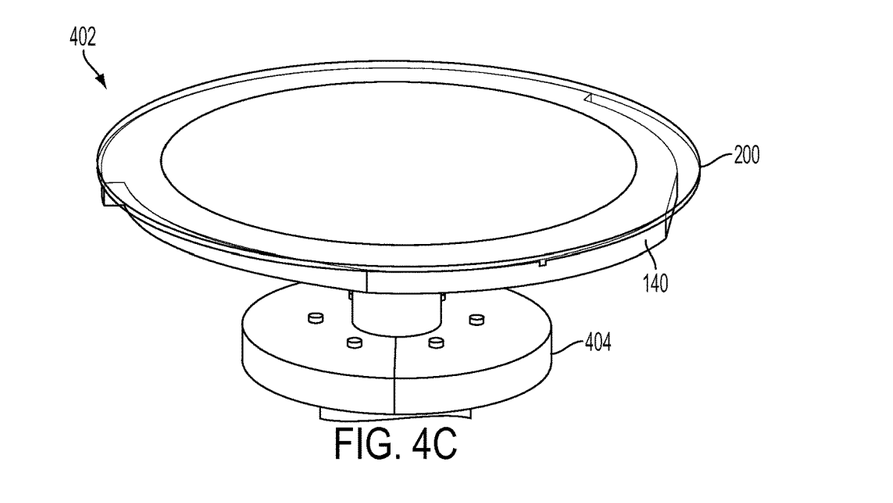
FIG. 4C illustrates a three-dimensional view of a pedestal sitting over a center column and connected to a base, which is configured to be connected to the lower chamber portion, in accordance with one embodiment.

FIG. 4C illustrates a three-dimensional view 402 of the pedestal 140 sitting over a center column and connected to a base 404, which is configured to be connected to the lower chamber portion 102b. This view shows how the carrier ring 200 is placed over the carrier support surface 140b and overhangs the side recessed regions of the pedestal 140, as shown in FIG. 4A.

Figure 5A:
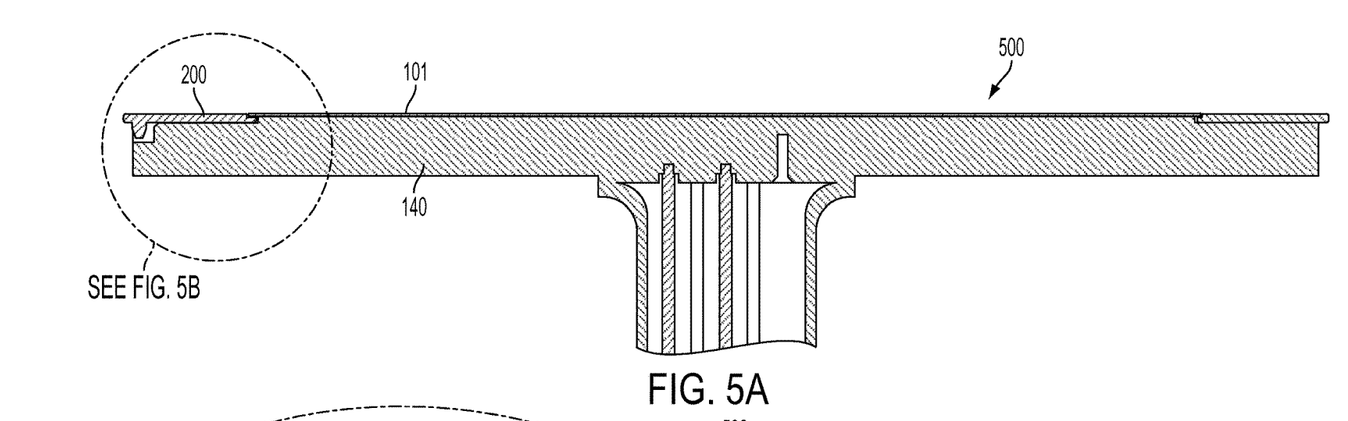
FIGS. 5A-5C illustrate cross-sectional views of the pedestal with a magnification of the edge of the pedestal and carrier ring, in accordance with one embodiment.

FIG. 5A illustrates a cross-sectional view 500 of the pedestal 140 with a magnification 502 of the edge of the pedestal 140. As shown, a wafer 101 is placed over the pedestal 140 and extends close to the edge magnification 502. The carrier ring 200 sits in the outer region of the pedestal 140 over the carrier support surface 140b, which was described in FIG. 4B. The carrier ring 200 includes a plurality of extensions 244 which secure the carrier ring 200 to prevent the carrier ring 200 from shifting during processing. The extensions 242 are configured to sit in the engagement locations 410, as shown in FIG. 4A.

Figure 5B:
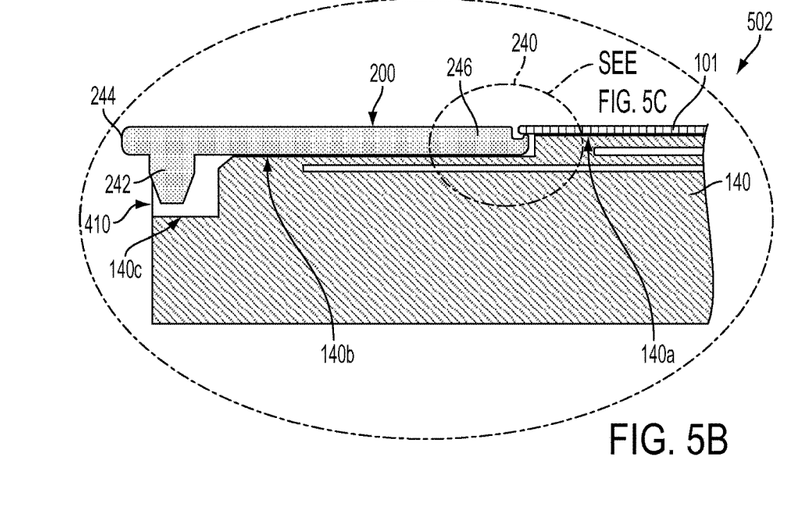

FIG. 5B shows more detail of the edge magnification 502. The extension 242 is shown sitting in the engagement location 410, at the engagement step 140c and also sitting over the carrier support region 140b. In one embodiment, the carrier ring 200 will sit over a plurality of contact supports located on the carrier support region 140b to enable precision placement in contact over the carrier support region 140b. The carrier ring 200 is a disk that has an outer radius that begins at the outer edge side 244 and extends to the inner radius that is located at the wafer edge side 240. In this illustration, the top surface of the wafer 101 is approximately at the level of the top surface 246 of the carrier ring 200. At the wafer edge side 240, the carrier ring 200 will include contact support structures that are placed at a height that is lower than the top carrier ring surface 246 so that the context support structures can be located below the wafer 101, which is configured to overhang the wafer support region 140a. In this manner, when the carrier ring 200 is lifted, the contact support structures at the tip of the carrier ring 200 at the wafer edge side 240, can lift the wafer 101 together with the lifting of the carrier ring 200.

Figure 5C:
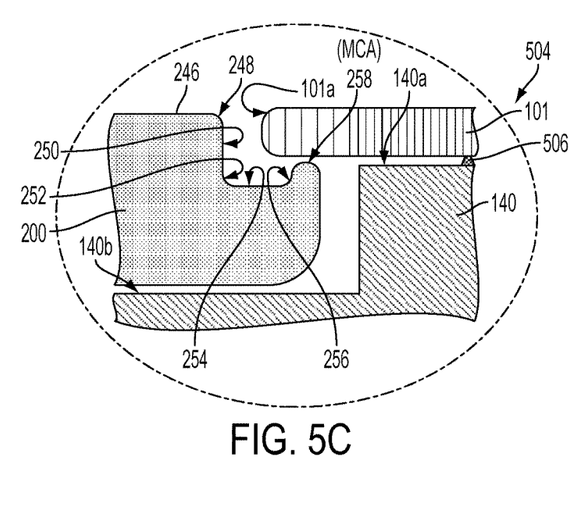

FIG. 5C illustrates in more detail the wafer edge side 240 and its relative placement to the wafer support region 140a and the wafer 101 when present. Also shown is the carrier ring 200 sitting at a spaced apart orientation from the carrier support region 140b, due to the contact support structures (not shown) that are formed on the carrier support region 140b to enable precision contact with the bottom surface of the carrier ring 200. In this illustration, contact support structures 506 are also provided over the wafer support region 140a, which defines a slight separation between the bottom surface of the wafer 101 and the wafer support region 140a. The contact support structures 506 are minimal contact areas (MCAs), which are used to enhance the precision (e.g., with higher tolerances) contact of the bottom of the wafer with the wafer support region 140a. In some embodiments, the contact support structures may be referred to as bumps with rounded or soft edge surfaces. The carrier ring 200 includes a transition between the top carrier ring surface 246 and a lower carrier ring surface 254.

The transition will include a top facing edge at 248 and a lower inner edge 252 and an upper vertical wall 250. This defines a step transition between the top carrier ring surface 246 and the lower carrier ring surface 254. It is noted that the top facing edge 248 has a rounded non-sharp edge, and the lower inner edge 252 is substantially curved to avoid having a sharp corner. Thus, both the top facing edge 248 and the lower edge 252 are substantially rounded, curved, smoothed, and substantially void of sharp corners, edges or points. By avoiding sharp edges at these transition points, any deposited or formed films and materials are more likely to adhere and not be subjected to mechanical stresses that can be imparted by the sharp edges or points that produce stresses to the materials. When stresses are applied to the materials or films, it is more likely that the materials or films may flake, chip, or produce particulates during processing.

Reducing the particulates in a system will avoid introduction of defects onto the surface of the wafer, and may also reduce troubleshooting necessary to identify defects and/or solve for the produce defects. As can be appreciated, these troubleshooting routines can reduce throughput of the tool and/or require excessive cleaning in between batches of wafers or after a number of wafers are processed. Also shown is an inner contact edge 256 that is defined next to the contact support structure 258. The contact support structure 258 is configured to have a rounded top region and the rounded top region extends toward the inner contact edge 256 and then down the inner radius at a lower vertical wall 259 of the carrier ring 200.

Thus, the contact support structure 258 will have tapered edges and corners that are void of sharp edges, sharp corners, sharp points, or sharp transitions between planes or surfaces. In this manner, if films are formed over the contact support structure 258 and/or the wafer edge side 240 region, the formed materials will better adhere to the surface even when physical contact is made by those surfaces, such as to the bottom side of the wafer during a lifting operation. By eliminating sharp edges, sharp corners, outer corners, inner corners, sharp points, sharp transitions between planes, or the like on the carrier ring proximate to the wafer edge side 240, stress points that may cause particulates during operation can be reduced or eliminated. In other embodiments, it is believed that defining the contact support structures 258 and the surfaces surrounding the contact support structures with the non-sharp edges will also expand the periods of time between cleanings of the system and/or the carrier ring 200, which can improve throughput (e.g., due to less down time to troubleshoot or clean).

In the example of FIG. 5C, the contact support structure 258 is shown as an extension of the carrier ring 200 at the tip where physical contact will be had with the lower portion of the wafer 101. In one embodiment, the contact support structure 258 is defined by a plurality of discrete contact support structures 258. For example, the plurality of discrete contact support structures 258 can be evenly distributed around the wafer edge side 240 of the carrier ring 200. In one implementation, six contact support structures 258 are evenly distributed around the edge side 240. In one implementation, six contact support structures evenly distributed would place one at every 60 degree radial offset, measured from the centerline of each one of the six (i.e., 360/6=60). Thus, the cross-sectional view shown in FIG. 5C is taken at one of the contact support structures 258. An example of a single contact support structure 258 is shown in FIG. 7C below, which sits over the lower carrier ring surface 254.

Figure 6A:
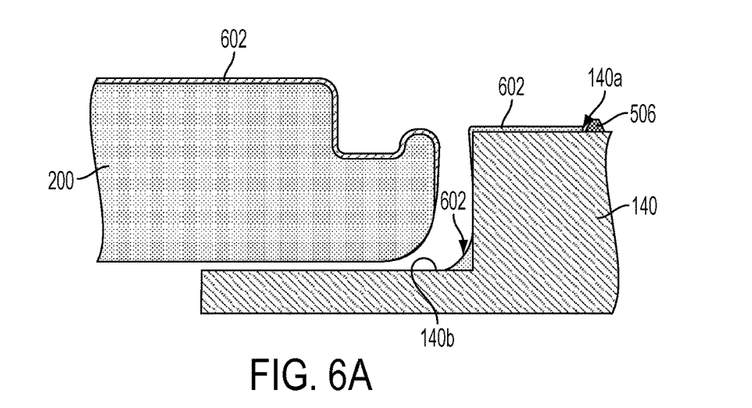
FIGS. 6A-6C illustrate an example film formation process, in accordance with one embodiment.

FIG. 6A illustrates a cross-sectional view of the pedestal 140 and a carrier ring 200 during an example processing step wherein an ashable hard mask (AHM) deposition operation is performed. In one operation, an undercoat and pre-coat film 602 is formed over the pedestal 140 and the carrier ring 200. It is believed that pre-coating the carrier ring 200 with a film similar to the film that will be formed over the wafer improves film formation over the wafer. Thus, it is customary that film 602 is formed before the wafer 101 is introduced onto the pedestal 140. Further, the pre-coat and undercoat of the wafer processing environment serve, in combination, for improved wafer film uniformity. Typical undercoat thickness is 3 microns and pre-coat is 0.5 microns (depends on the process). The AHM film (i.e., carbon) is deposited onto oxide films (and other times, nitride films). It should be understood that the coatings or films may be of any deposited material and need not be related to an AHM film. Other films applied or that fall or form on the contact support structures will benefit from the rounded, curved or smooth geometries defined herein, when the carrier ring 200 lifts a bottom side of a wafer.

Film 602 is shown to conform only from over the top surface of the carrier ring 200 and the top surface 140a of the pedestal 140, and in some corners of the pedestal 140 near the carrier support surface 140b. In one embodiment, the carrier ring 200 is made of aluminum oxide (AlO2), so deposition over the aluminum oxide carrier ring 200 will improve formation of the hard mask over the wafer instead of having a naked carrier ring 200 sitting beside the wafer 101 during the film formation.

Figure 6B:
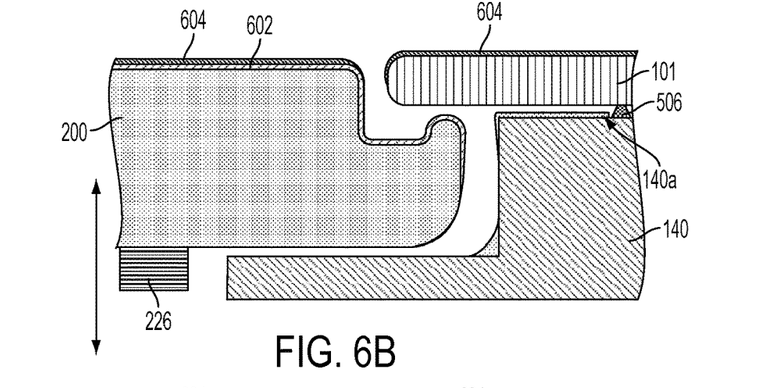
Figure 6C:
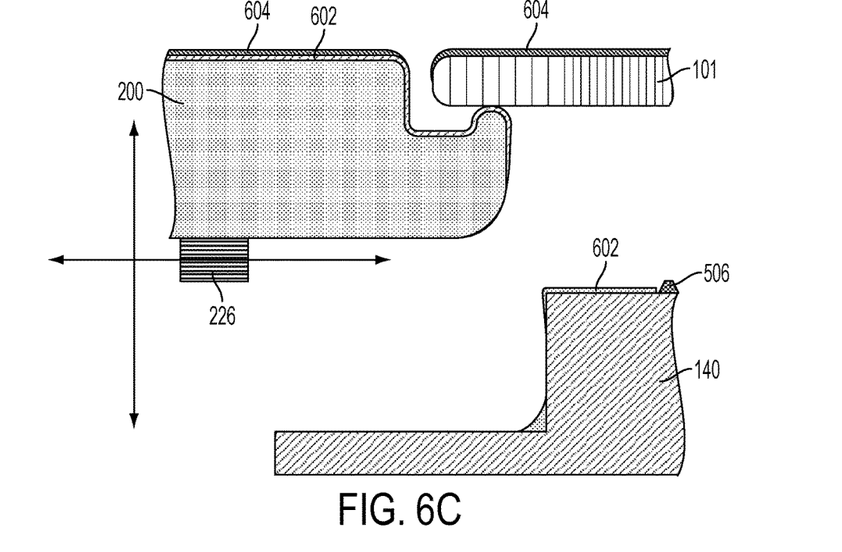

FIG. 6B illustrates the formation of the ashable hard mask (AHM) 604 over the film 602 of the carrier ring 200 and also a top surface of the wafer 101. The AHM 604 is conformal to the surface it is deposited on and covers the exposed top surfaces of the carrier ring 200 including the top facing edge 248 and the lower inner edge 252 and upper vertical wall 250. In FIG. 6C, it is shown that after the film formation operation is complete, the arm of the spider forks 226 will lift the carrier ring 200 vertically upward to a point where contact is made between the contact support structures 258 and a lower undersurface of the wafer 101 near the wafer edge.

Although contact is physically made between the carrier ring 200 and the wafer 101, the material that was formed over the contact support structure 258 is configured to withstand the forces of lifting and contact with the bottom of the wafer 101 for a number of times without causing excessive stresses to the formed films over the contact support structures 258. The non-sharp edges of the rounded portions of the contact support structures 258 ensure that less stresses placed upon the top of the contact support structure 258 where contact is made with the bottom of the wafer 101. As mentioned above, the non-sharp edges, which are preferably rounded, curved, substantially curved, and void of sharp transitions or points will ensure for longer utilization of the carrier ring 200 without requiring cleaning operations or causing particulates that would require further examination of defects over the surface of the wafer 101.

Figures 7A, 7B:
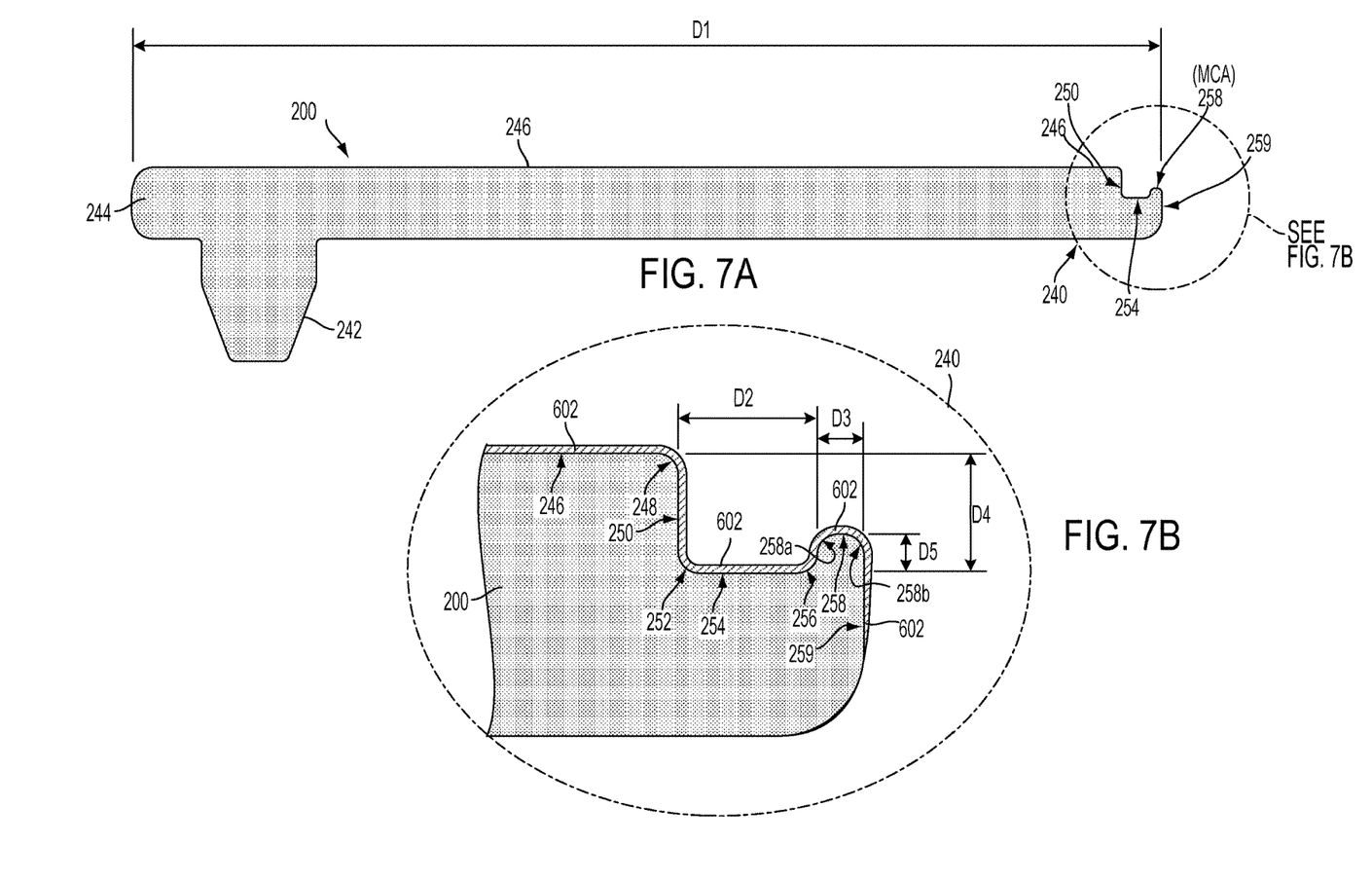
FIGS. 7A-7C illustrate additional cross-sectional views of the carrier ring and the contact support structures, in accordance with one embodiment.
Figure 7C:
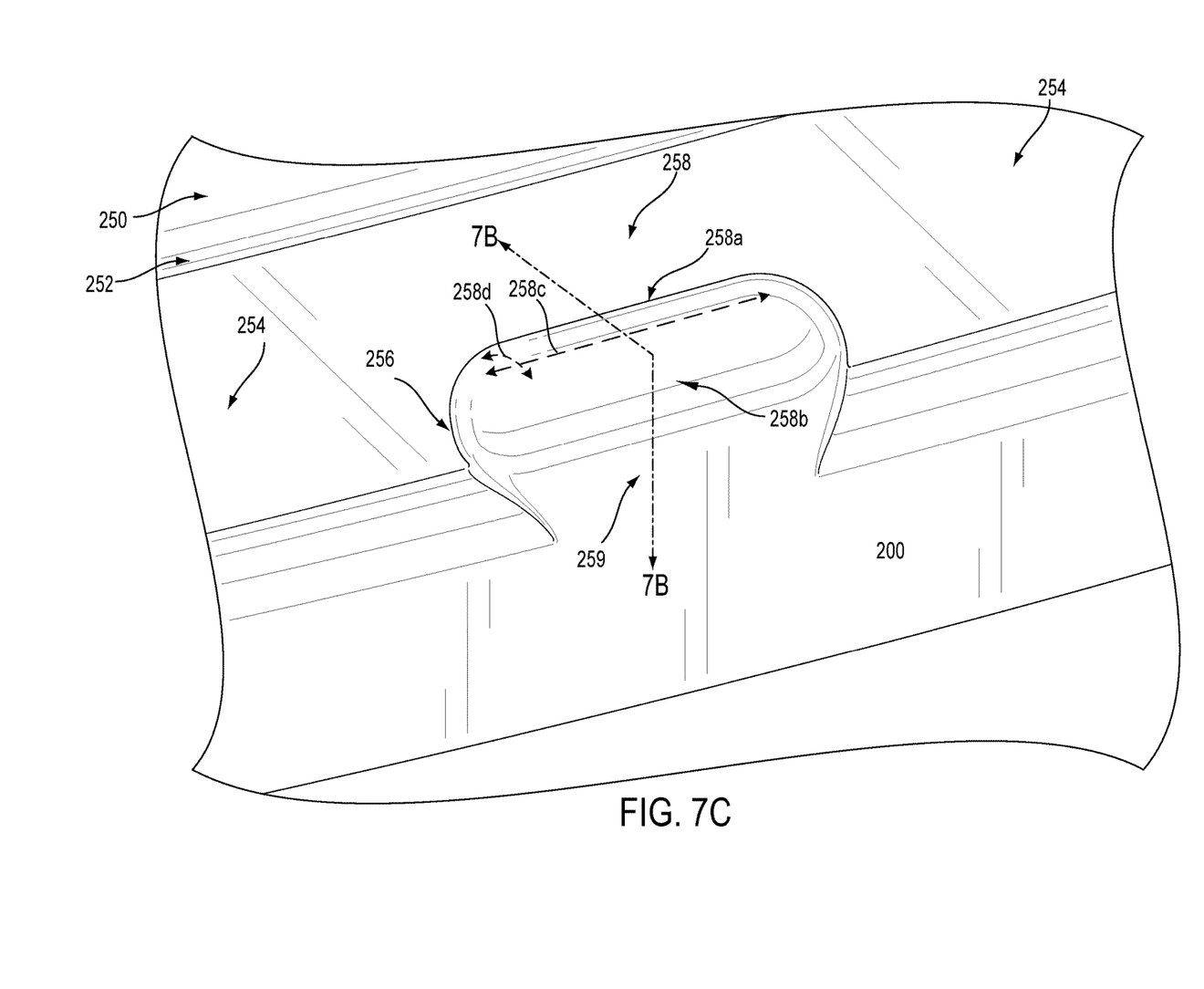

FIG. 7A illustrates a cross-sectional view of the carrier ring 200 and the outer edge side 244, and the wafer edge side 240. Also shown is the extension 242 near the outer edge side of the carrier ring 200. The top surface 246 of the carrier ring 200 extends annularly as the top surface of the disk which defines the carrier ring 200 and is the top surface that is substantially planar with the top surface of the wafer when placed over the wafer support region of the pedestal 140 or in another embodiment slightly lower than the top surface of the wafer, as shown. Wafer edge side 240 is shown in more detail in FIG. 7B, which shows the undercoat and pre-coat film 602 formed thereon.

In one embodiment, the carrier ring 200 is designed for use with a 300 mm wafer. As such, the dimensions provided herein should be viewed as scalable to other size wafers, wither smaller, e.g., 200 mm, or larger, e.g., 450 mm. Further, the dimensions provided herein should be understood to be adjustable within a tolerance, e.g., up to or about +/−10% or some reduced or increased tolerance that is deemed applicable to the environment in which the carrier ring 200 is used and the tools and process parameters likely to be used when implementing the carrier ring 200. With this understanding in place, the following dimensions should be viewed as one example and not limiting on any specific configuration. In one example, the carrier ring 200 has an annular dimension D1 (i.e., inner radius minus outer radius), at an annular cross-section, of about 41.5 mm. A distance D4 between the lower carrier ring surface 254 and the top carrier ring surface 248 is about 1.17 mm. The distance D5 or height of the contact support structure 258, as measured up from the lower carrier ring surface 254 is about 0.356 mm. The approximate distance D3 from the lower vertical wall 259 and the inner contact edge 256 of is about 1.24 mm. The distance D2 between the lower inner edge 252 and the inner contact edge 256, along the lower carrier ring surface is about 2.54 mm. In one embodiment, the rounded upper surfaces 258a and 258b of the contact support structures 258 each have a rounded edge radius of about 0.254 mm.

Film 602 is conformably formed over the non-sharp edges of the carrier ring 200 in the wafer edge side 240. As discussed above, the contact support structure 258 preferably has a rounded surface to avoid introducing sharp edges near the location where physical contact will be made with the wafer when the carrier ring 200 is lifted to and in contact with the bottom side of the wafer 101. In this example, the contact support structure 258 is shown to have a height extending from the lower carrier ring surface 254 that is lower than the top carrier ring surface 246. Having the contact support structure 258 at a lower height than the top carrier ring surface 246 enables the contact support structure 258 to be placed under an overhanging wafer 101.

FIG. 7C shows in more detail one of the plurality of contact support structures 258 that may be placed symmetrically or non-symmetrically distributed around the inner radius of the carrier ring 200 over the lower carrier ring surface 254. The views of FIGS. 7A and 7B are views taken at a cross-section of a single one of the contact support structures 258. As noted above, one example embodiment will utilize six contact support structures 258. Other embodiments may utilize more or less contact support structures 258.

In this detailed view of the contact support structure 258, it is shown that the top surface where contact will occur with the wafer 101 may extend along a contact length 258*c*, and a rounded top surface 258*d* of the contact support structure 258 also defines where contact will occur. This illustration shows that the carrier ring surface 254 will extend to the edge of the carrier ring 200 where no contact support structure 258 is present. Where the contact support structure 258 is present, the wall 259 will extend up from the edge of the carrier ring 200 toward the rounded or curved top surface of the contact support structure 258. Although the contact support structure 258 is shown to have a pill-like or capsule-like rounded top structure, in other embodiments the contact support structure 258 may have a reduced length 258*c*, such as in cases where the contact support structure is a rounded ball or spherical protraction, i.e., instead of pill-like or capsule-like.

In some embodiments, each contact support structure 258 is referred to as minimum contact area (MCA), and MCAs are used to improve precision mating between surfaces when high precision or tolerances are required. In the context of the present embodiments, precision is required so that the carrier ring 200 making contact with the underside of the wafer will make precision contact with each of the contact support structures 258. As mentioned above, other areas in the system can utilize MCA's, such as over the carrier support surface 140*b*, and over the wafer support region 140*a* of the pedestal 140. For this reason, a space is shown in FIG. 5C between the carrier ring 200 and the carrier support surface 140*b* and a space is shown between the wafer 101 and the wafer support region 140*a* (e.g., by the shown MCA 506 and others (not shown) distributed thereon).

Figure 8:
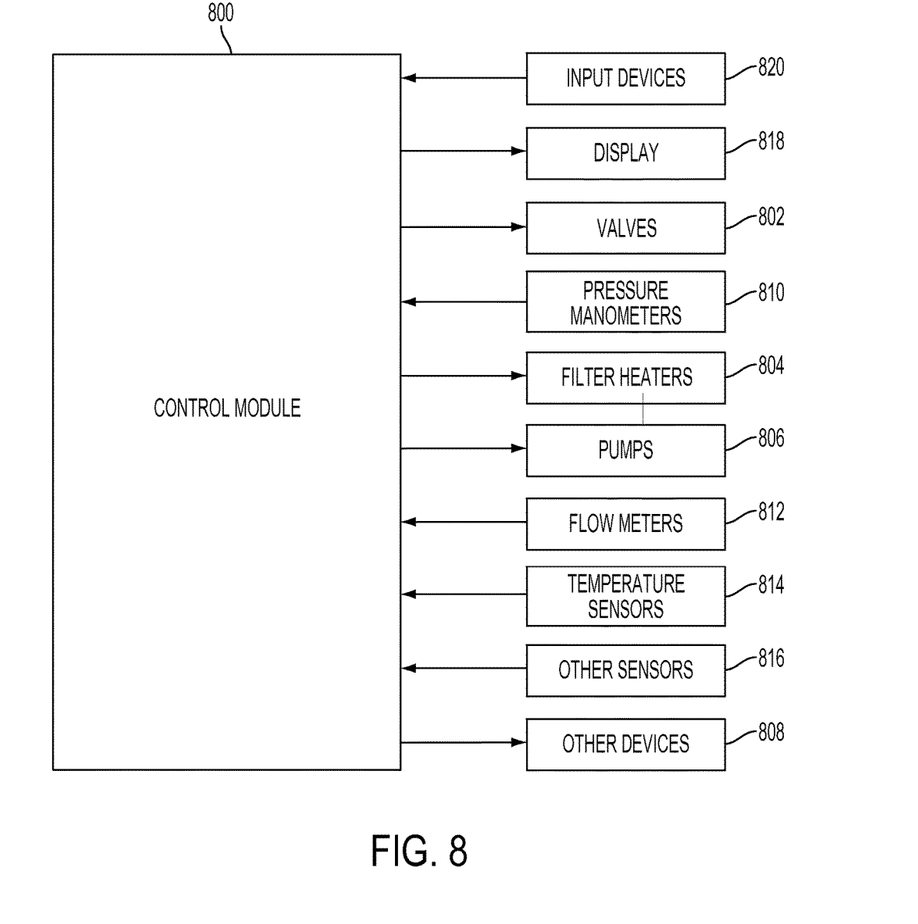
FIG. 8 shows a control module for controlling the systems, in accordance with one embodiment.

FIG. 8 shows a control module 800 for controlling the systems described above. In one embodiment, the control module 110 of FIG. 1 may include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A carrier ring for use in a chamber implemented for depositing films, comprising,
    the carrier ring having an annular disk shape with an outer edge side and a wafer edge side, the carrier ring having a top carrier ring surface that extends between the outer edge side to the wafer edge side, the wafer edge side includes,
        a lower carrier ring surface that is lower than the top carrier ring surface;
        a plurality of contact support structures, each contact support structure located at an edge of the lower carrier ring surface and having a height that is between the lower carrier ring surface and the top carrier ring surface, each contact support structure having tapered edges and corners that are defined by substantially curved surfaces that are void of sharp corners, and each of the plurality of contact support structures is integral with the carrier ring and respectively have a lower vertical wall that extends up at the edge of the lower carrier ring surface to define the wafer edge side of the carrier ring;
        a step between the top carrier ring surface and the lower carrier ring surface, wherein a top facing edge is disposed at a top of the step and a lower inner edge is disposed at bottom of the step;
        an inner contact edge at a transition between the lower carrier ring surface and the contact support structure, and each of the top facing edge and the lower inner edge have a rounded non-sharp edge;
    wherein a top of each of the contact support structure is configured for contact with a bottom edge surface of a wafer for lifting and lowering and moving the wafer.

2. The carrier ring of claim 1, wherein the chamber used for depositing films comprises,
    a pedestal having a wafer support region and a carrier support surface encircling the wafer support region, the carrier support surface being a step down from the wafer support region;
    a fork having a first arm arranged around a first side portion of the pedestal and a second arm arranged around a second side portion of the pedestal,
    wherein each of the first and second arms being located below the carrier support surface when in a non-engaged state that does not contact an under surface of the carrier ring, and when in an engaged state each of the first and second arms contact the under surface of the carrier ring to lift the wafer.

3. The carrier ring of claim 2, wherein the wafer when disposed over the wafer support region is configured to overhang over a portion of the carrier support surface, and each contact support structure is configured to be oriented under the overhang of the wafer.

4. The carrier ring of claim 3, wherein in the non-engaged state a non-contact separation distance is defined between the bottom edge surface of the wafer and the top of each contact support structure.

5. The carrier ring of claim 4, wherein in the engaged state contact is made between the bottom edge surface of the wafer and the top of each of the contact support structure, wherein deposition material present over the top of each contact support structure is substantially maintained over the top of each contact support structure when contact is made in the engaged state.

6. The carrier ring of claim 1, wherein the chamber further includes,
    a showerhead that is configured to be oriented over a pedestal during operation, the showerhead configured to provide process gases to enable deposition of a film over the wafer;
    an radio frequency (RF) power supply connected via a match network to the pedestal, wherein during operation the RF power supply further enables the deposition of the film over the wafer.

7. The carrier ring of claim 6, wherein the deposited film is an ashable hardmask (AHM) used as an etch stop in subsequent etch operations.

8. The chamber of claim 6, wherein the chamber further includes,
    a set of stations defined in the chamber, each station including a pedestal, a fork, and a carrier ring;
    a mechanism configured to control movement of each of the forks of each of the stations simultaneously, wherein the movement includes,
    lifting or lowering each of the carrier rings; and
    rotating each of the carrier rings to another one of the set of stations.

9. A chamber for processing deposition on a wafer, comprising,
    a pedestal having a wafer support region and a carrier support surface encircling the wafer support region, the carrier support surface being a step down from the wafer support region;
    a fork having a first arm arranged around a first side portion of the pedestal and a second arm arranged around a second side portion of the pedestal, each of the first and second arms being located below the carrier support surface when in a non-engaged state and configured to rise above the carrier support surface when in an engaged state;
    a carrier ring having an annular disk shape with an outer edge side and a wafer edge side, the carrier ring having a top carrier ring surface that extends between the outer edge side to the wafer edge side, the wafer edge side includes, a lower carrier ring surface that is lower than the top carrier ring surface;

a plurality of contact support structures, each contact support structure located at an edge of the lower carrier ring surface and having a height that is between the lower carrier ring surface and the top carrier ring surface, each contact support structure having tapered edges and corners that are defined by substantially curved surfaces that are void of sharp corners, and each of the plurality of contact support structures is integral with the carrier ring and respectively have a lower vertical wall that extends up at the edge of the lower carrier ring surface to define the wafer edge side of the carrier ring, wherein a top of each of the contact support structure is configured for contact with a bottom edge surface of the wafer when the fork lifts the carrier ring for raising and moving the wafer.

10. The chamber of claim 9, wherein the wafer edge side includes, a step between the top carrier ring surface and the lower carrier ring surface, wherein a top facing edge is disposed at a top of the step and a lower inner edge is disposed at a bottom of the step, wherein each of the top facing edge and the lower inner edge have a rounded non-sharp edge.

11. The chamber of claim 10, wherein the wafer edge side further includes, an inner contact edge at a transition between the lower carrier ring surface and the contact support structure.

12. The chamber of claim 9, wherein the wafer when disposed over the wafer support region is configured to overhang over a portion of the carrier support surface and each contact support structure is configured to be oriented under the overhang of the wafer.

13. The chamber of claim 12, wherein in the non-engaged state a non-contact separation distance is defined between the bottom edge surface of the wafer and the top of each contact support structure.

14. The chamber of claim 13, wherein in the engaged state contact is made between the bottom edge surface of the wafer and the top of each of the contact support structure, wherein deposition material present over the top of each contact support structure is substantially maintained over the top of each contact support structure when contact is made in the engaged state.

15. The chamber of claim 9, wherein the chamber further includes, a showerhead that is configured to be oriented over the pedestal during operation, the showerhead configured to provide process gases to enable deposition of a film over the wafer;

an radio frequency (RF) power supply connected via a match network to the pedestal, wherein during operation the RF power supply further enables the deposition of the film over the wafer.

16. The chamber of claim 15, wherein the deposited film is an ashable hardmask (AHM) used as an etch stop in subsequent etch operations.

17. The chamber of claim 15, further comprising, a set of stations defined in the chamber, each station including a pedestal, a fork, and a carrier ring;

a mechanism configured to control movement of each of the forks of each of the stations simultaneously, wherein the movement includes, lifting or lowering each of the carrier rings; and rotating each of the carrier rings to another one of the set of stations.

18. The chamber of claim 17, wherein each of the stations includes lift pins in at least one of the pedestals, the lift pins used to raise the wafer to enable an end-effector to pick or place a wafer in a station of the chamber.

19. The chamber of claim 17, wherein the chamber is interfaced with a controller for managing the mechanism, the process gases, and the RF power supply during operation.

20. A carrier ring for use in a chamber implemented for depositing films, the carrier ring having an annular disk shape with an outer edge side and a wafer edge side, the carrier ring having a top side that extends between the outer edge side to the wafer edge side, the carrier ring comprising, a lower carrier ring surface disposed proximate to the wafer edge side of the carrier ring, the lower carrier ring surface is lower than a top carrier ring surface disposed proximate to the outer edge side of the carrier ring; and a plurality of contact support structures formed from the carrier ring and disposed along an edge of the wafer edge side of the carrier ring, each of the plurality of contact support structures having a height that extends above the lower carrier ring surface and below the top carrier ring surface, and each contact support structure has tapered edges and corners and each of the plurality of contact support structures is integral with the carrier ring and respectively have a lower vertical wall that extends up at the edge of the lower carrier ring surface to define the wafer edge side of the carrier ring.

21. The carrier ring of claim 20, further comprising, a step between the top carrier ring surface and the lower carrier ring surface.

22. The carrier ring of claim 21, wherein a top of each of the contact support structures is configured for contact with a bottom edge surface of a wafer, the contact support structures used for lifting, lowering or moving the wafer.

23. The carrier ring of claim 20, wherein the wafer edge side further includes, an inner contact edge at each transition between the lower carrier ring surface and each of the contact support structures.

24. The carrier ring of claim 20, wherein the tapered edges and corners of the contact support structures have a substantially curved surface that is void of sharp corners.

* * * * *